United States Patent [19]

Napoli et al.

[11] 3,764,865

[45] Oct. 9, 1973

[54] SEMICONDUCTOR DEVICES HAVING CLOSELY SPACED CONTACTS

[75] Inventors: Louis Sebastian Napoli, Hamilton Square; Walter Francis Reichert, East Brunswick, both of N.J.

[73] Assignee: RCA Corporation, New York, N.Y.

[22] Filed: Mar. 17, 1970

[21] Appl. No.: 20,257

[52] U.S. Cl. ...... 317/235 R, 317/235 B, 317/235 U, 317/235 Y, 29/578

[51] Int. Cl. ........................ H01l 11/00, H01l 15/00

[58] Field of Search ........... 317/234, 235 B, 235 M, 317/235 X, 235 Y, 235 AG, 235 AJ, 235 AK; 29/578

[56] References Cited

UNITED STATES PATENTS

| | | | |
|---|---|---|---|
| 3,333,168 | 7/1967 | Hofstein | 317/235 |
| 3,564,309 | 2/1971 | Nobel et al. | 317/235 X |

OTHER PUBLICATIONS

Fabrication of Monolithic Integrated Circuit Structure By A Semiconductor Etching Technique, by Ames et al., Vol. 9, No. 1, June 69, IBM Technical Disclosure Bulletin, page 110.

*Primary Examiner*—John W. Huckert
*Assistant Examiner*—Andrew J. James
*Attorney*—Glenn H. Bruestle

[57] ABSTRACT

A semiconductor device having at least two contacts on a body of semiconductor material. One of the contacts is in a plane spaced from the plane of the other contacts and the edges of the one contact are in substantial alignment with the adjacent edges of the other contacts. The material under either the edges of the one contact or the adjacent edges of the other contacts is removed so that such edges project in cantilever fashion beyond the material under the respective contact.

9 Claims, 16 Drawing Figures

INVENTORS
LOUIS S. NAPOLI and
WALTER F. REICHERT.
BY

Donald S. Cohen

ATTORNEY

INVENTORS
LOUIS S. NAPOLI and
WALTER F. REICHERT
BY
[signature]
ATTORNEY

SEMICONDUCTOR DEVICES HAVING CLOSELY SPACED CONTACTS

BACKGROUND OF INVENTION

The present invention relates to semiconductor devices and to methods of making the same.

Many semiconductor devices have two or more metal film areas on the same surface of a body of semiconductor material. For such devices it is often desirable to have the metal film area as close as possible to each other without contacting so as to minimize the size of the device and/or to improve the electrical characteristics of the device.

For example, a field effect transistor in general comprises a body of semiconductor material having a source in ohmic contact with the body and a drain in ohmic contact with the body but spaced from the source so as to provide a channel in the body between the source and the drain. A gate is provided over the channel and between the source and drain. The gate may be a junction gate wherein a rectifying junction is provided between the gate and the body, or an insulated gate wherein a layer of an electrical insulating material is provided between the body and the gate. In such field effect transistors it is desirable to have the distance between the source and drain as well as the distance between the gate and each of the source and drain at a minimum to provide the transistor with a short transit time and high cut off frequency.

SUMMARY OF INVENTION

A semiconductor device comprises a body including a semiconductor material having a stepped surface. A first contact is on one of the steps of the surface. The contact on the uppermost of the steps extends in cantilever fashion beyond the edge of the surface on which it is disposed.

DETAILED DESCRIPTION

Figure 1:
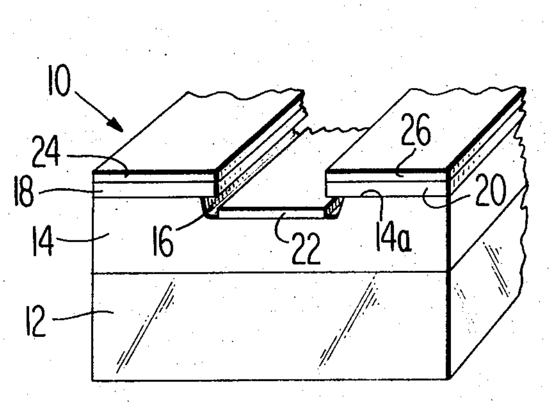
FIG. 1 is a perspective view of one form of a semiconductor device of the present invention.

Referring initially to FIG. 1, one form of a semiconductor device of the present invention is generally designated as 10. Semiconductor device 10 comprises a substrate 12 of an electrical insulating material having on a surface thereof an epitaxial layer 14 of a semiconductor material of one conductivity type, either P type or N type. The layer 14 may be of any well known semiconductor material, such as silicon, germanium or a group III–V compound semiconductor material, which contains a suitable conductivity modifier. The substrate 12 may be of any well known insulating material on which the particular semiconductor material of layer 14 can be epitaxially deposited, such as sapphire, spinel or the same semiconductor material as the layer 14 which is doped so as to have a very high resistance. The semiconductor material layer 14 has a shallow substantially flat bottom recess 16 in its surface 14*a*. The recess 16 extends across the semiconductor material layer 14 and is positioned so that there is a portion of the surface 14a on both sides of the recess. Thus, the semiconductor layer 14 has a stepped surface which includes two co-planar, spaced surface steps on opposite sides of and above a third surface step, the bottom of the recess 16.

Metal contacts 18 and 20 are provided on the surface 14a of the semiconductor material layer 14 at opposite sides of the recess 16 and are in ohmic contact with the semiconductor material layer. The edges of the contacts 18 and 20 which are adjacent the sides of the recess 16 project beyond the portions of the semiconductor material layer 14 which is beneath the respective contacts so that they slightly overhang the recess in cantilever fashion. The contacts 18 and 20 are films of any metal which will form a good ohmic contact with the particular semiconductor material of the semiconductor material layer 14. For example, if the semiconductor material layer 14 is of silicon or germanium, the contacts may be films of aluminum, tungsten or chrome-gold. If the semiconductor material layer 14 is a III–V compound semiconductor material, the contacts 18 and 20 may be one of the well known contact alloys, such as germanium and gold, or germanium, silver and indium, or gallium and gold, or silver and manganese.

A metal film 22 is provided on the bottom surface of the recess 16. The metal film 22 is of a metal which will form a Shottky surface barrier junction with the particular semiconductor material of the semiconductor material layer 14. For example, indium, tin, or lead may be used on germanium, or platinum silicide on silicon, or nickel or gallium-gold alloy on gallium arsenide.

The metal film 22 is of a width such that the edges of the metal film are in substantial alignment with the adjacent overhanging edges of the contacts 18 and 20 along planes which are perpendicular to the surface 14a of the semiconductor material layer 14. However, the depth of the recess 14 is slightly greater than the thickness of the metal film 22 so that the metal film 22 is spaced from the contacts 18 and 20 along the planes perpendicular to the surface 14*a*. For reasons which will be explained, the contacts 18 and 20 are coated with films 24 and 26 of the same metal as the metal film 22.

Figure 2:
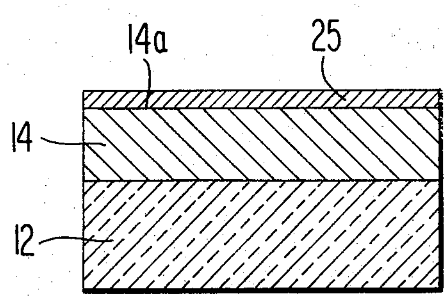
FIGS. 2, 3 and 4 are sectional views showing the steps of making the semiconductor device of FIG. 1.
Figure 3:
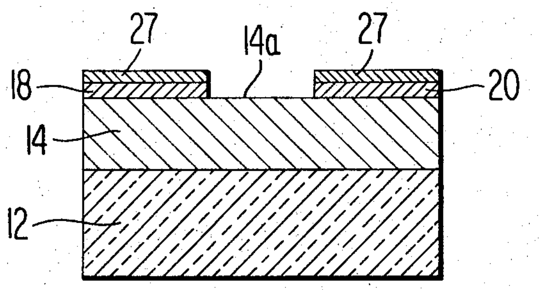

To make the semiconductor device 10 one starts with a substrate 12 of electrical insulation material having thereon an epitaxial layer 14 of the semiconductor material. As shown in FIG. 2, a film 25 of the metal of the contacts 18 and 20 is then coated on the entire surface 14a of the semiconductor material layer 14. This can be done by evaporation of the metal in a vacuum and depositing the metal on the surface 14*a*. A masking layer 27 of a suitable resist material is then coated on the portions of the metal film 25 which are to provide the contacts 18 and 20 using standard photolitographic techniques, and, as shown in FIG. 3, the uncovered portion of the metal film 25 is etched away using a suitable etchant for the particular metal of the film 25. This provides the contacts 18 and 20 with the portion of the surface 14a therebetween being exposed.

Figure 4:
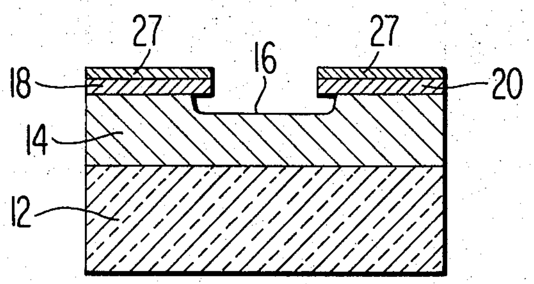

As shown in FIG. 4, the recess 16 is then formed in the exposed portion of the surface 14*a* of the semiconductor material layer 14. This is achieved by etching the exposed portion of the semiconductor material layer 14 with a suitable etchant. Hydrofluoric acid can be used for etching germanium and silicon and the III–V compound semiconductor materials can be etched with Caro's acid, an aqueous solution of sulfuric acid and hydrogen peroxide. During the etching operation, the semiconductor material layer 14 will not only be etched perpendicular to the surface 14*a* but also slightly along the surface 14*a*. Thus, some of the semiconductor material layer 14 will be etched away from under the edges of the contacts 18 and 20 leaving the edges of the contacts overhanging the recess 16. The recess 16 is etched to a depth slightly greater than the thickness of the metal film to be provided. The masking layer 27 can be removed either before or after the recess 16 is etched in the semiconductor material layer 14.

The metal film 22 is then coated on the bottom surface of the recess 16. One method of coating the metal film 22 is by evaporation in a vacuum wherein a source of the metal of the metal film 22 and the semiconductor device 10 are placed in a chamber which is evacuated. The source of the metal is heated to a temperature at which the metal evaporates and the metal vapors are condensed on the bottom surface of the recess 16 to form the metal film 22. The source of the metal is positioned substantially directly over the recess 16 so that the overhanging edges of the contacts 18 and 20 shadow mask the side walls of the recess 16 from the metal vapors. Thus, the metal vapors condense only on the bottom surface of the recess 16 between the edges of the contacts 18 and 20 so that the edges of the resultant metal film 22 are substantially in alignment with the overhanging edges of the contacts 18 and 20 as shown in FIG. 1. The metal vapors also condense on the surfaces of the contacts 18 and 20 to form the metal films 24 and 26 which then serve as part of the contacts. The metal films of the contacts 18, 20 and the metal film 22 may be heat treated in a manner well known in the art to provide the desired ohmic contacts and Shottky barrier junction with the semiconductor layer 14.

Figure 5:
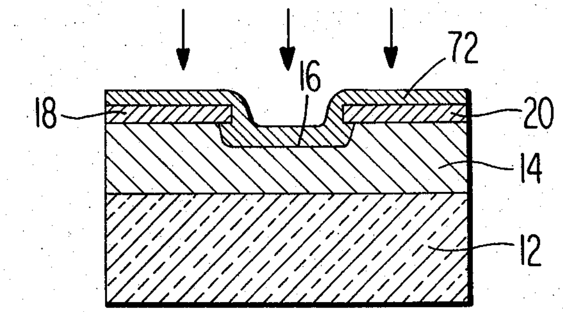
FIGS. 5 and 6 are sectional views showing the steps of a modification of the method of making the semiconductor device.
Figure 6:
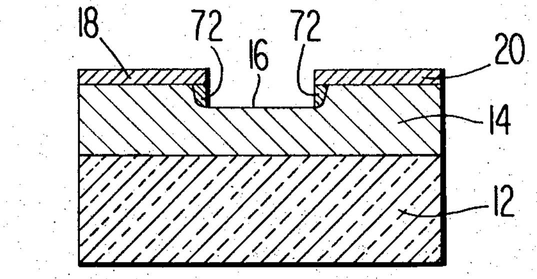

Another method of coating the metal film 22 on the bottom of the recess 16 is shown in FIGS. 5 and 6. For this method the recess 16 is filled with a photosensitive resist material 72 of the type which is made easily removed, when subjected to light as shown in FIG. 5. As shown, the resist material 72 may also be coated over the contacts 18 and 20 to ensure that the recess 16, including the portions under the overhanging edges of the contacts 18 and 20, is completely filled. A beam of light is then directed downwardly onto the resist material in a direction perpendicular to the contacts 18 and 20 as indicated by the arrows in FIG. 5. This exposes all of the resist material except those portions which are directly under and masked by the overhanging edges of the contacts 18 and 20. The resist material which is so exposed to the light is sensitized so as to make the resist material easily removable by a suitable developer, whereas the unexposed portions of the resist material is not so removable. The sensitized resist material is then washed away leaving the unsensitized portions under the overhanging edges of the contacts 18 and 20 as shown in FIG. 6. The remaining portions of the resist material 72 mask the portion of the surface of the recess 16 under the overhanging edges of the contacts 18 and 20 leaving exposed only the portion of the bottom surfaces of the recess which is between the overhanging edges of the contacts. The contact 22 is then coated on the exposed portion of the bottom surface of the recess 16 using any well known coating technique, such as evaporation in a vacuum, electroplating or electroless plating. If desired, the remaining portions of the resist material can then be removed with a suitable solvent.

The semiconductor device 10 can be used as a field effect transistor with the contacts 18 and 20 being the source and drain and the metal film 22 being the gate. This provides a field effect transistor with a junction type gate. Since the spacing between the source and drain contacts 18 and 20 is formed by photolithographic techniques, this spacing can be made very small, as little as 1 micron. Since the gate contact 22 is on a plane spaced from the plane of the source and drain contacts 18 and 20 and the gate contact is formed by a shadow masking technique, the contact can be provided across substantially the entire spacing between the source and drain contacts without engaging the source and drain contacts. Thus, the source to gate and drain to gate distances can be made very small, as little as 0.1 microns. Therefore, a field effect transistor 10 can be made with a small source to drain distance as well as small source to gate and drain to gate distances so as to provide the field effect transistor with a short transit time and a high cut off frequency.

The semiconductor device 10 can also be used as a planar Shottky surface carrier type diode. As a diode, the metal film 22 not only provides the surface barrier junction with the semiconductor material layer 14 but also acts as a contact to one side of the diode. Either or both of the contacts 18 and 20 provide the contacts to the other side of the diode. As previously stated, the metal film 22 can be made very narrow and the spacing between the metal film 22 and the contacts 18 and 20 can be made very small. Thus, the semiconductor device 10 can provide a very small diode.

Figure 7:
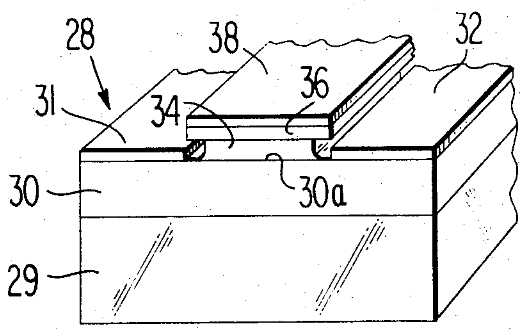
FIG. 7 is a perspective view of another form of a semiconductor device of the present invention.

Referring to FIG. 7, another form of the semiconductor device, which will be initially described as a field effect transistor, is generally designated as 28. Field effect transistor 28 comprises a substrate 29 of an electrical insulating material having on a surface thereof an epitaxial layer 30 of a semiconductor material of one conductivity type, either P type or N type. The substrate 29 and the semiconductor material layer 30 may be respectively of the same materials previously described for the substrate 12 and semiconductor material layer 14 of the semiconductor device 10 of FIG. 1. A pair of spaced, parallel metal contacts 31 and 32 are provided on the surface 30a of the semiconductor material layer 30. The contacts 31 and 32 are the source and drain of the field effect transistor 28 and are films of any metal which will form a good ohmic contact with the particular semiconductor material of the semiconductor material layer 30, such as the metals previously described for the contacts 18 and 20 of the semiconductor device 10 of FIG. 1.

A layer 34 of an electrical insulating material, such as silicon dioxide, silicon nitride, aluminum oxide or combinations thereof, is provided on the surface 30*a* of the semiconductor material layer 30 between the source and drain contacts 31 and 32. The insulating layer 34 is of a thickness slightly greater than the thickness of the source and drain contacts 31 and 32. The side edges of the insulating layer 34 are tapered or curved so that at least the top surface of the insulating layer is of a width less than the distance between the source and drain contacts 31 and 32. The semiconductor material layer 30 and the insulating layer 34 provide a body having a stepped surface which includes the portions of the surface of the semiconductor layer on opposite sides of the insulating layer as two co-planar surface steps and the surface of the insulating layer as the third surface step above the co-planar surface steps.

A gate contact 36 is provided on the surface of the insulating layer 34. Gate contact 36 is a film of an electrically conductive metal and can be of the same metal as the source and drain contacts 31 and 32. The gate contact 36 is of a width substantially equal to the distance between the source and drain contacts 31 and 32 so that the edges of the gate contact are substantially in alignment with the adjacent edges of the source and drain contacts along planes perpendicular to the surface 30a of the semiconductor material layer 30. Since the surface of the insulating layer 34 is narrower than the distance between the source and drain contacts 31 and 32, the edges of the gate contact 36 project in cantilever fashion beyond the sides of the insulating layer 34. For reasons which will be explained, the gate contact 36 is coated with a film 38 of the same metal as the source and drain contacts 31 and 32. Thus, the field effect transistor 28 is an insulated gate type field effect transistor.

Figure 8:
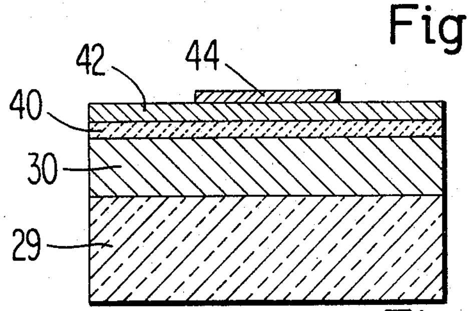
FIGS. 8, 9 and 10 are sectional views showing the steps of making the semiconductor device of FIG. 7.

To make the insulated gate field effect transistor 28 one starts with a substrate 29 of electrical insulation material having thereon an epitaxial layer 30 of the semiconductor material. As shown in FIG. 8, a layer 40 of the electrical insulating material is coated on the surface 30*a* of the semiconductor material layer 30. The insulating material 40 may be formed by pyrolytically reacting a gas containing the elements of the insulating material in the presence of the device to deposit the insulating material on the semiconductor material layer 30. For example, a layer of silicon dioxide can be deposited by heating a mixture of silane and either oxygen or water vapor at a temperature of between 200°C and 400°C. A layer of silicon nitride can be deposited by heating a mixture of silane and amonia vapors to a temperature of 600°C to 1,200°C. A layer of aluminum oxide can be deposited by heating a mixture of aluminum chloride, carbon dioxide and hydrogen to a temperature of slightly above 900°C.

Figure 9:
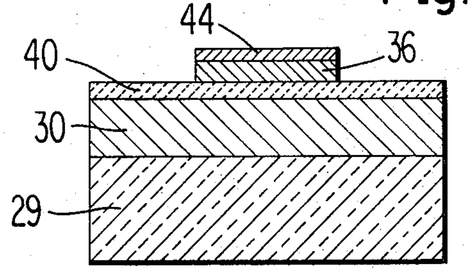

A film 42 of the particular metal for the gate contact is then coated over the insulating material layer 40. Thic can be achieved by the well known process of evaporation in a vacuum. A masking layer 44 of a resist material is then coated over the portion of the metal layer 42 which is to form the gate contact using standard photolithographic techniques. As shown in FIG. 9, the exposed portion of the metal layer 42 is then removed, such as by etching with an etchant suitable for the particular metal of the metal layer. This leaves the gate contact 36 on the insulating material layer 40.

Figure 10:
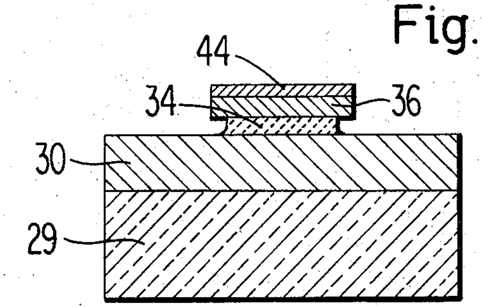

As shown in FIG. 10, the exposed portion of the insulating material layer 40 is then removed, such as by etching with an etchant suitable for the particular material of the insulating material layer. For example, silicon dioxide can be removed with hydrofluoric acid and both silicon nitride and aluminum oxide can be removed with hot phosphoric acid at about 180°C. During the removal of the exposed portion of the insulating material layer 40 some of the insulating material under the edges of the gate contact 36 will also be removed. This provides the insulating layer 34 with the gate contact 36 projecting slightly beyond each side thereof. The masking layer 44 is then removed with a suitable solvent.

The source and drain contacts 31 and 32 are then simultaneously coated on the exposed surface 30*a* of the semiconductor layer 30 at opposite sides of the insulating layer 34. This can be achieved by evaporation in a vacuum in the manner previously described for depositing the contact 22 of the semiconductor device 10 of FIG. 1. In the deposition of the source and gate contacts 31 and 32 the evaporation source of the metal is located so that the side edges of the gate contact 36 shadow mask the sides of the insulating layer 34. Thus the metal films forming the source and gate contacts 31 and 32 are deposited on the surface 30*a* of the semiconductor material layer 30 only up to the edges of the gate contact 36 so that the edges of the gate contact are in substantial alignment with the adjacent edges of the source and drain contacts as shown in FIG. 7. The vapors of the metal forming the source and drain contacts also deposit on the gate contact 36 to form the metal film 38 which acts as part of the gate contact. The source and drain 31 and 32 can also be coated on the exposed surfaces of the semiconductor layer 30 by the photoresist masking technique previously described with regard to FIGS. 5 and 6.

Since the width of the gate contact 36 is defined by photolithographic techniques, it can be made very narrow. Since the source and drain contacts 31 and 32 are on a plane spaced from the plane of the gate contact 36 and the source and drain contacts are formed by a shadow masking technique and edge of each of the source and drain contacts is in substantial alignment with an adjacent edge of the gate contact without engaging the gate contact. Thus, the source to gate and drain to gate distances can be made very small. Therefore, the field effect transistor 28 can be made with a small source to drain distance as well as small source to gate and drain to gate distances so as to provide the field effect transistor with a short transit time and a high cut off frequency.

The semiconductor device 28 can also be formed as a planar Shottky surface barrier type diode. For a diode, the layer 34 would be of a semiconductor material, preferably the same semiconductive material as the layer 30, of the same conductivity type as the layer 30 but of a resistivity much lower than that of the layer 30. The contacts 31 and 32 would be of a metal which would provide a Shottky surface barrier junction with the semiconductor material layer 28. Thus, the contacts 31 and 32 would be the contacts to one side of the diode and the contact 36 would be the contact to the other side of the diode.

Figure 11:
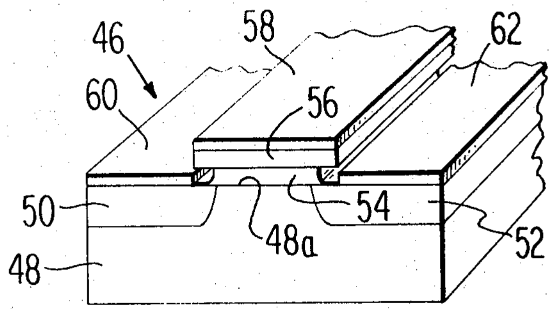
FIG. 11 is a perspective view of still another form of a semiconductor device of the present invention.

Referring to FIG. 11 another form of the semiconductor device, which is a field effect transistor, is generally designated as 46. Field effect transistor 46 comprises a body 48 of a semiconductor material of one conductivity type, either P type or N type, having a flat surface 48*a*. Spaced, parallel source and drain regions 50 and 52 are provided in the body 48 at the surface 48*a*. The source and drain regions 50 and 52 are low resistivity regions which contain a high concentration of a conductivity type modifier of either the same type as that of the body 48 or of the opposite type.

A first electrical insulating layer 54 is provided on the surface 48a of the body 48 between the source and drain regions 50 and 52, and a second electrical insulating layer 56 is provided on the first insulating layer 54. The insulating layers 54 and 56 are of different materials which can be selectively etched by different etchants which will not attack the material of the other layer. For example, the first insulating layer 54 may be silicon dioxide which can be etched with hydrofluoric acid and the second insulating layer 56 may be either silicon nitride or aluminum oxide which can be etched with hot phosphoric acid. The first insulating layer 54 extends slightly over the source and drain regions 50 and 52. The second insulating layer 56 is of a width so that its edges project in cantilever fashion beyond the side edges of the first insulating layer 54. In the field effect transistor 46, like in the field effect transistor 28 of FIG. 7, the semiconductor body 48 and the first insulating layer 54 provide a body having a stepped surface.

A gate contact 58 covers the entire surface of the second insulating layer 56 and source and drain contacts 60 and 62 are on the surface 48a of the body 48 over the source and drain regions 50 and 52 respectively. The gate, source and drain contacts 58, 60 and 62 are films of an electrically conductive metal. The source and drain contacts 60 and 62 are of a width such that their edges which are adjacent the gate contact 58 are in substantial alignment with the adjacent edges of the gate contact along places perpendicular to the surface 48a of the body 48.

Figure 12:
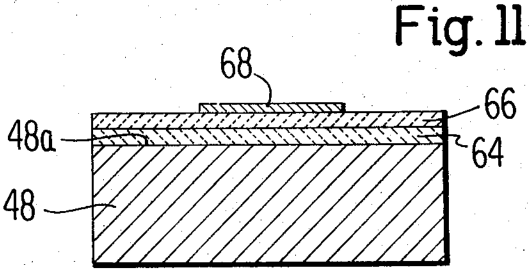
FIGS. 12–16 are sectional views showing steps of making the semiconductor device of FIG. 11.

To make the field effect transistor 46, one starts with a body 48 of the semiconductor material of the desired conductivity type which has a flat surface 48*a*. As shown in FIG. 12, a layer 64 of the insulating material which is to form the first insulating layer 54 is coated over the entire surface 48*a* of the body 48. Then a layer 66 of the insulating material which is to form the second insulating layer 56 is coated over the entire surface of the layer 64. The layers 64 and 66 may be formed by pyrolytically reacting a gas containing the elements of the insulating material to deposit the insulating material on the body 48. For example, silicon dioxide can be deposited by heating a mixture of silane and either oxygen or water vapor at a temperature of between 200°C and 400°C. Silicon nitride can be deposited by heating a mixture of silane and amonia vapor to a temperature of between 600°C and 1,200°C. Aluminum oxide can be deposited by heating a mixture of aluminum chloride, carbon dioxide and hydrogen to a temperature of slightly above 900°C.

Figure 13:
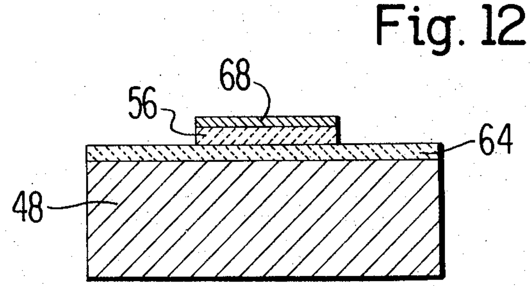
Figure 14:
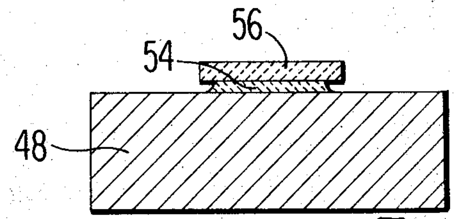

A masking layer 68 of a resist material is then provided on the portion of the layer 66 which is to form the second insulating layer 56 using standard photolithographic techniques. The exposed portion of the layer 66 is then removed with a suitable etchant so as to provide the second insulating layer 56 as shown in FIG. 13. Since, as previously stated, the second insulating layer 56 is of a material which can be etched by an etchant which will not attack the material of the layer 64, this leaves exposed portions of the layer 64 at opposite sides of the second insulating layer 56. The exposed portions of the layer 64 are then removed with a suitable etchant so as to form the first insulating layer 54 as shown in FIG. 14. During the etching of the layer 64 some of the material is etched away from under the edges of the second insulating layer 56 so that the edges of the second insulating layer project beyond the side edges of the first insulating layer 54. Also, this now exposes portions of the surface 48*a* of the body 48 at opposite sides of the first insulating layer 54. The masking layer 68 can now be removed with a suitable solvent.

Figure 15:
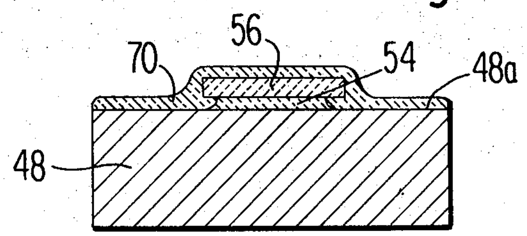
Figure 16:
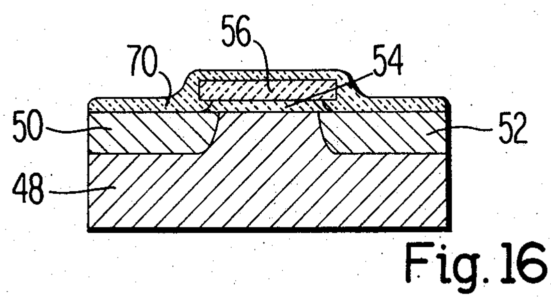

The source and drain regions 50 and 52 are then formed in the body 48 by diffusing into the exposed portions of the surface 48*a* the desired conductivity modifier. For example, if the source and drain regions 50 and 52 are to be P type, boron can be used as the conductivity modifier and if the source and drain regions are to be N type, phosphorous can be used as the conductivity modifier. To achieve this, exposed portions of the surface 48*a* can be coated with a layer 70 of a glassy material, such as silicon dioxide, which contains the desired conductivity modifier, such as boron or phosphorous, as shown in FIG. 15. The layer 70 can be formed by heating a mixture of gases containing the elements of layer 70, such as a mixture of silane, oxygen and either diborane as the source of boron or phosphine as a source of phosphorous, to a temperature at which the gases react between 350°C and 450°C, to deposit silicon dioxide containing either boron or phosphorous on the surface 48*a*. The layer 50 will also be deposited over the second insulating layer 56. The device is then heated to a temperature about 1,100°C, at which the conductivity modifier in the layer 70 will diffuse into the body 48 to form the source and drain regions 50 and 52 as shown in FIG. 16. During the diffusion operation the conductivity modifier will not only diffuse into the body 48 but also slightly along the surface 48*a* so that the source and drain regions 50 and 52 will extend slightly under the first insulating layer 54. However, the second insulating layer 56 will act as a mask to prevent diffusion of the conductivity modifier into the body 48 under the major portion of the first insulating layer 54. The layer 78 is then removed, such as by etching with hydrofluoric acid, so as to expose the second insulating layer 56 and the portions of the surface 48a of the body 48 over the source and drain regions 50 and 52.

The gate, source and drain contacts 58, 60 and 62 are then coated on the second insulating layer 56 and the exposed portions of the surface 48*a* over the source and drain regions 50 and 52. This can be achieved by evaporation in a vacuum wherein a source of the metal to form the contacts and the device are placed in an evacuated chamber and the metal source is heated to evaporate the metal. The metal vapors condense on the second insulating layer 56 and the portions of the body surface 48a over the source and drain regions 50 and 52 to provide the contacts. The source of metal is positioned over the second insulating layer 56 so that the projecting edges of the second insulating layer shadow mask the side edges of the first insulating layer 54. Thus, the metal is condensed on the body surface 48*a* only up to the edges of the second insulating layer 56 so that the edges of the gate contact 58 are in substantial alignment with the adjacent edges of the source and drain contacts 60 and 62. The contacts can also be applied by the photosensitive resist masking technique previously described with regard to FIGS. 5 and 6.

Since the distance between the source and drain regions 50 and 52 is defined by the width of the second insulating layer 56 which is defined by photolithographic techniques, the source to drain distance can be small. Also, since the source and drain contacts 60 and 62 are on a plane of the gate contact 58 and the contacts are formed by a shadow masking technique, the edges of the gate contact are in substantial alignment with the adjacent edges of the source and drain contacts without engaging the source and drain contacts. Thus, the source to gate and drain to gate distances can be made very small. Therefore, the field effect transistor 46 can be made with a small source to drain distance as well as small source to gate and drain to gate distances so as to provide the field effect transistor with a short transit time and high cut off frequency.

Although the semiconductor devices 10 and 28 of FIGS. 1 and 7 are shown to comprise a semiconductor material layer supported on an insulating substrate, they can similarly comprise a body which is entirely of the semiconductor material. Likewise, the semiconductor device 46 of FIG. 11, which is formed on a body which is entirely of the semiconductor material, can be similarly formed on a layer of the semiconductor material support on an insulating substrate.

We claim:

1. A semiconductor device comprising:

a. a body including semiconductor material having a pair of spaced co-planar surfaces and a third surface between but transversely spaced from said pair of surfaces, b. a separate metal film contact on each of said surfaces, c. the edges of the contact on the third surface being in substantial alignment with the adjacent edges of the contacts on said pair of surfaces along a plane transverse to said surfaces, and d. each contact on an uppermost of said surfaces extending in cantilever fashion beyond the edge of the surfaces on which it is disposed.

2. A semiconductor device in accordance with claim 1 in which the pair of co-planar surfaces are surfaces of the semiconductor material.

3. A semiconductor device in accordance with claim 2 in which the third surface is the bottom of a recess in the semiconductor material between the pair of co-planar surfaces, the contacts on the pair of surfaces each have an edge which projects beyond a separate side wall of the recess so as to be cantilevered over the recess.

4. A semiconductor device in accordance with claim 3 in which the recess is of a depth slightly greater than the thickness of the contact on the third surface.

5. A semiconductor device in accordance with claim 3 in which the contacts on the pair of surfaces are in ohmic contact with the semiconductor body and the contact on the third surface forms a surface barrier junction with the semiconductor body.

6. A semiconductor device in accordance with claim 2, in which the third surface is the surface of a layer of an electrical insulating material on the semiconductor material between the pair of surfaces, the contact on the surface is on the insulating layer and the side edges of the contact on the third surface project beyond the side edges of the surface of the insulating layer.

7. A semiconductor device in accordance with claim 6 including a second layer of an electrical insulating material between the said first insulating layer and the contact on the third surface, the side edges of said second insulating layer project beyond the side edges of the surface of said first insulating layer and the contact on the second insulating layer extends over the full width thereof.

8. A semiconductor device in accordance with claim 7 in which the second insulating layer is of a material which will not be attacked by an etchant for the material of the first insulating layer.

9. A semiconductor device in accordance with claim 7 including spaced regions of low resistivity in the body at said pair of surfaces and under the contacts on the pair of surfaces.

* * * * *